US005269877A

United States Patent [19]

Bol

[11] Patent Number: 5,269,877

[45] Date of Patent: Dec. 14, 1993

[54] FIELD EMISSION STRUCTURE AND METHOD OF FORMING SAME

[75] Inventor: Igor I. Bol, Sherman Oaks, Calif.

[73] Assignee: Xerox Corporation, Stamford, Conn.

[21] Appl. No.: 908,200

[22] Filed: Jul. 2, 1992

[51] Int. Cl.[5] ........................ B44C 1/22; C03C 15/00; H01L 21/306

[52] U.S. Cl. .................................... 156/628; 156/643; 156/656; 156/657; 156/659.1; 156/662

[58] Field of Search ............... 156/656, 628, 643, 657, 156/659.1, 662

[56] References Cited

U.S. PATENT DOCUMENTS 4,878,900 11/1989 Dugan et al. ........................ 156/656

FOREIGN PATENT DOCUMENTS 0072959 6/1979 Japan .................................. 156/656

OTHER PUBLICATIONS

Yao, Arney, and MacDonald, "Fabrication of High Frequency Two-Dimensional Nanoactuators for Scanned Probe Devices", Journal of Microelectromechanical Systems, vol. 1, No. 1, Mar. 1992, pp. 14–21.

Orvis, McConaghy, Ciarlo, Yee and Hee, "Modeling and Fabricating Micro-Cavity Integrated Vacuum Tubes", IEEE Transactions On Electron Devices, vol. 36, No. 11, Nov. 1989, pp. 2651–2657.

*Primary Examiner*—Carl F. Dees
*Attorney, Agent, or Firm*—Nola Mae McBain

[57] ABSTRACT

A process for making a tip microstructure in amorphous silicon or polysilicon. A layer of nitride is first deposited on the amorphous silicon or polysilicon. Then the amorphous silicon or polysilicon is roughly patterned to form the base of the tip structure. the tip is carved out of the amorphous silicon or polysilicon by using an oxide growth process that is controlled by the amount of dopant in the amorphous silicon or polysilicon. After the tip is carved, the oxide is stripped away exposing the tip.

13 Claims, 6 Drawing Sheets

FIELD EMISSION STRUCTURE AND METHOD OF FORMING SAME

BACKGROUND OF INVENTION

This invention relates generally to field emission structures, such as those used in vacuum microelectronic devices and more particularly concerns fabrication methods for making the field emission structure.

Field emission structures have been used in a variety of devices including vacuum micro tubes (W. J. Orvis et al "Modeling and Fabricating Micro-Cavity Integrated Vacuum Tubes", IEEE Transactions on Electron Devices, Vol. 36. no. 11. November 1989). These elements can be made in a variety of ways. In a paper by Yao, Arney, and MacDonald in the Journal of Microelectromechanical systems, vol. 1, no. 1, March 1992 titled Fabrication of High Frequency Two-Dimensional Nanoactuators for Scanned Probe Devices a two-dimensional field emission structure is made by following the process steps of:

A) depositing an oxide-nitride-oxide stack on a substrate and an aluminum mask on the stack, B) etching the stack and the substrate to form a protruding structure, C) depositing a sidewall mask on the protruding structure, D) performing an isotropic recess etch to form an undercut structure in the protruding structure and to start forming the field emission structure, E) performing an isolation oxidation to finish forming the field emission structure, F) removing the oxidation to release the structure.

This process results in a pair of conical tips that can be used in scanned probe devices. This process is cumbersome because it uses many complex steps to form the pair of complex tips and because some of the steps, such as the isotropic recess etch are difficult to control and reproduce with accuracy.

SUMMARY OF THE INVENTION

Briefly stated and in accordance with the present invention, there is provided a process for making tip structures, in conical or other shapes by a new sequence of processing steps.

A substrate is prepared with a structural layer of a material that may be oxidized. It is important that the oxidation rate of the material be controllable. In the example to be given, the oxidation rate is controlled by doping the material with specific impurities. The concentrations of the impurities determine the rate of oxidation.

The structural layer is patterned into a rough column or rail to locate the rough shape of the final tip structure. Once rough patterning has been accomplished, the oxide bumpers are grown on the structural layer by oxidizing the structural layer. The oxidation rate is controlled by the impurity levels so that the top portion of the column oxidizes much faster than the lower portions of the column. Therefore, the top portion will be oxidized much faster than the lower portions. After a determinable period of time, the top of the column will be nearly completely oxidized while the lower portions will be comparatively unoxidized. The unoxidized portions at the top of the column will come to a sharp point or tip. The larger unoxidized portion underneath the point will form a base or support for the tip.

The remaining step is to remove the oxide bumpers to expose the unoxidized tip.

In a variation of this procedure opposed tip pairs may be produced. A substrate is again prepared with a structural layer of a material that may be oxidized. The structural layer is patterned into a rough column or rail to locate the rough shape of the final opposed tip pair structure. Once rough patterning has been accomplished the structural layer is oxidized. The oxidation rate is controlled by the impurity levels so that the middle portion of the column oxidizes much faster than either the lower or upper portions of the column. Therefore the middle portion will be oxidized much faster than either the upper or the lower portions. After a determinable portion of time, the middle of the column will be completely oxidized while the upper and lower portions are still comparatively unoxidized. The unoxidized portions around the middle of the column will come to two sharp points or tips. The larger unoxidized portions on either side of the points will form bases or supports for the tips. As before, the final step is to remove the oxidation to expose the unoxidized tips.

NUMERICAL LIST OF ELEMENTS

10 substrate

Figure 1:
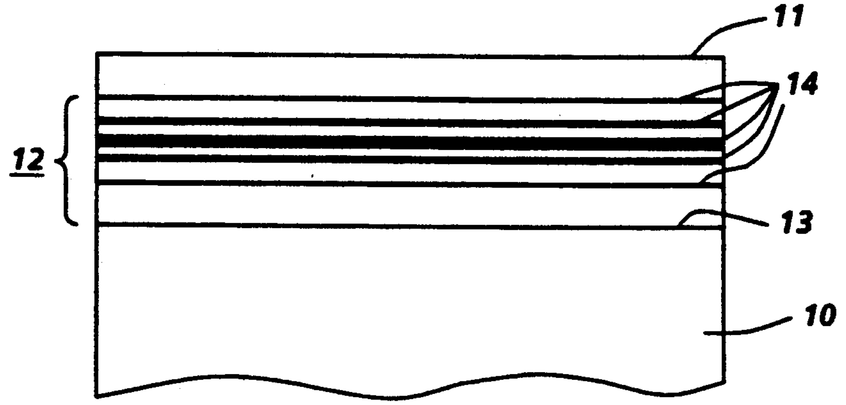
FIG. 1 is a cross-section of a substrate after deposition of a structural layer of amorphous silicon or polysilicon.

11 surface of amorphous silicon or polysilicon 12 amorphous silicon or polysilicon
13 interface of substrate and amorphous silicon or polysilicon
14 dopant concentration profile
16 nitride layer
18 photo resist
20 oxide
22 tip structure
24 base
26 sharp point
28 photoresist
30 metal

DESCRIPTION OF THE INVENTION

Figure 2:
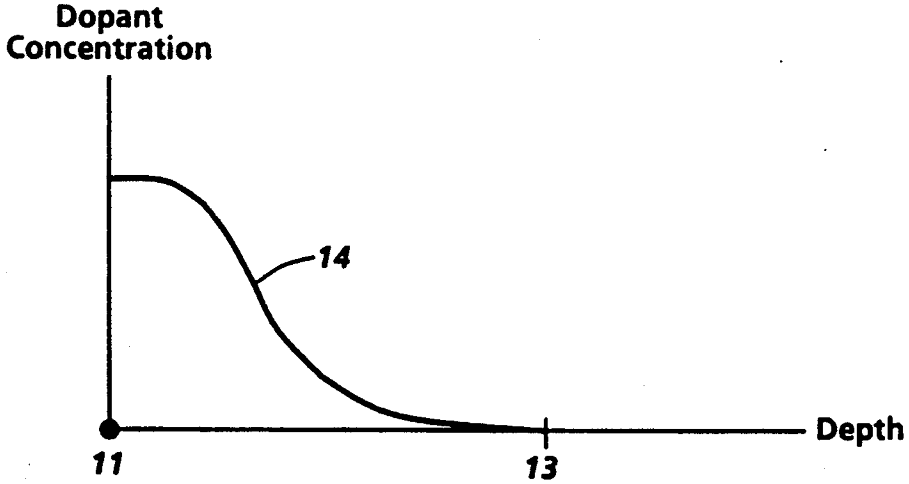
FIG. 2 is a graph describing the dopant concentration in the structural layer of amorphous silicon or polysilicon shown in FIG. 1.

The structure is produced on a substrate 10 as shown in FIG. 1. While silicon is convenient for the substrate 10 it is not necessary for the process. A 1.5-2.0 micron layer of amorphous silicon or polysilicon 12 with a surface 11 is deposited on the substrate 10. The amorphous silicon or polysilicon 12 will have a dopant concentration profile 14, as shown in FIGS. 1 and 2, that is highest at the surface 11 of the amorphous silicon or polysilicon 12. The dopant concentration will be the least at the amorphous silicon or polysilicon 12 interface 13 with the substrate 10. This dopant concentration can be accomplished in several ways, either by in situ doping or by ion implantation followed by diffusing. Both of these processes are well known and standard in the art.

Figure 3:
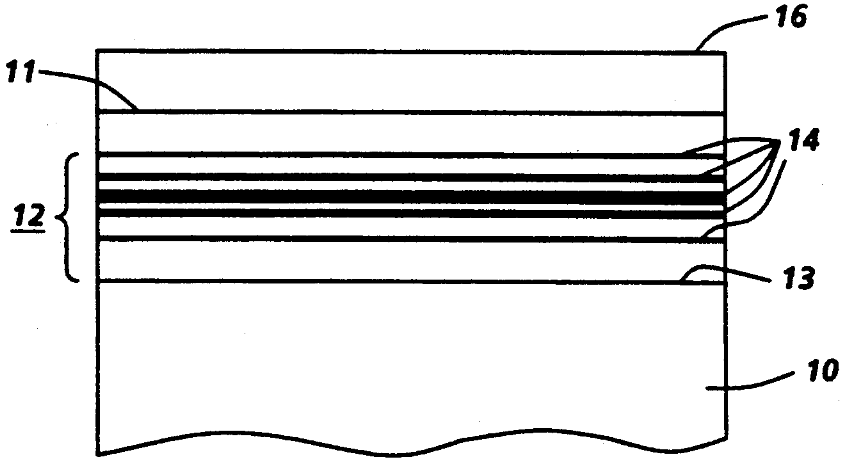
FIG. 3 is a cross-section of the substrate shown in FIG. 1 after nitride deposition.

In FIG. 3, a nitride layer 16, 0.3-0.4 microns thick, has been deposited on the amorphous silicon or polysilicon 12. If it is desired to produce the dopant concentration profile 14 by ion implantation and annealing rather than by in situ doping the ion implantation and annealing steps may be done before the deposition of the nitride layer 16.

Figure 4:
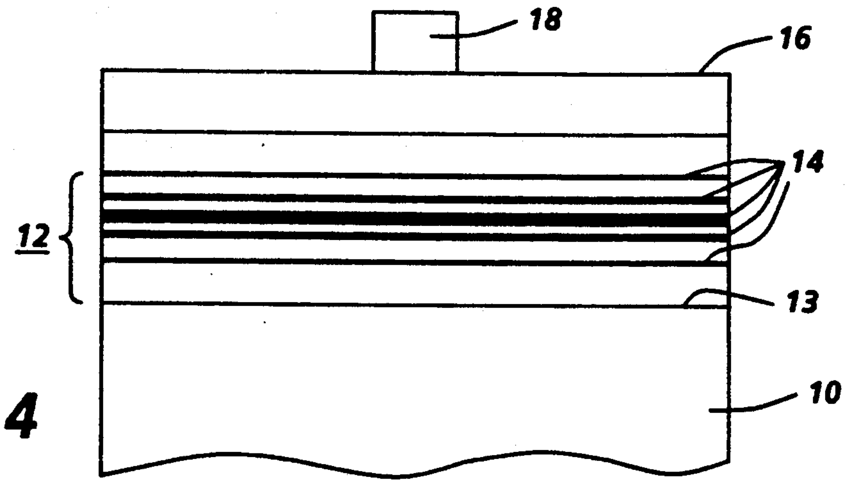
FIG. 4 is a cross-section of the substrate shown in FIG. 3 after photoresist patterning.
Figure 5:
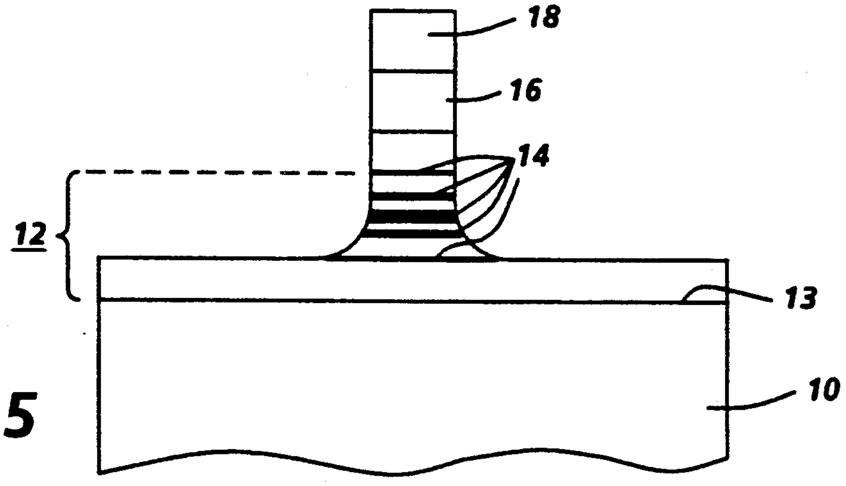
FIG. 5 is a cross-section of the substrate shown in FIG. 4 after patterning the structural layer of amorphous silicon or polysilicon.

As shown in FIG. 4 the next step is to pattern the nitride layer 16 and the amorphous silicon or polysilicon 12 by conventional photoresist processes. FIG. 5, shows the nitride layer 16, and the amorphous silicon or polysilicon 12 etched using conventional dry etching techniques. The amorphous silicon or polysilicon 12 will have tapered sidewalls due to the dopant concentration profile 14 in the amorphous silicon or polysilicon layer 12. The larger dopant concentration speeds up the etching process.

Figure 6:
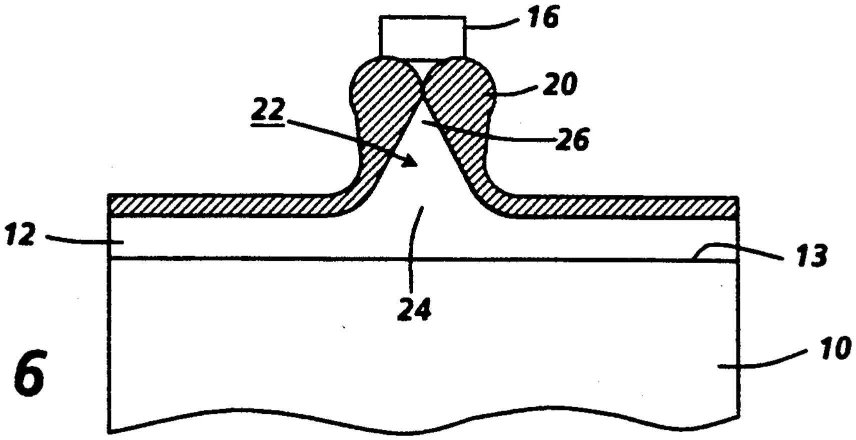
FIG. 6 is a cross-section of the substrate shown in FIG. 5 after oxidation.

The amorphous silicon or polysilicon 12 is then oxidized to grow oxide bumpers 20 as shown in FIG. 6. The growth and control of oxide bumpers is discussed in U.S. Pat. No. 4,400,866 and 4,375,643 by Bol and Keming, both titled Application of Grown Oxide Bumper Insulators to a High Speed VLSI SASMEFET, incorporated by reference herein. The oxide bumpers will grow faster where the dopant concentration is the largest. Referring back to FIGS. 1 and 2, the dopant concentration is the largest at the surface 11 of the amorphous silicon or polysilicon 12. The oxide bumper 20 will grow fastest and thickest near the surface 11 of the amorphous silicon or polysilicon 12. The nitride layer 16 on the surface 11 of the amorphous silicon or polysilicon 12 will contribute to the shape of the oxide bumper 20. Since oxygen does not diffuse through nitride, no oxide will be grown on the nitride layer 16. The ability of oxygen to oxidize the amorphous silicon or polysilicon 12 will be reduced at the amorphous silicon or polysilicon 12 and nitride layer 16 interface 13 since the oxygen will have a reduced ability to diffuse along that interface due to protection of amorphous silicon or polysilicon 12 by the nitride layer 16. This phenomenon is very similar to the one responsible for the Bird's Beak formation in the CMOS or NMOS LOCOS processes. The oxidation rates will be fastest somewhat below the interface 13 and decrease with the decreasing dopant concentration.

As the oxide bumper 20 grows, the remaining amorphous silicon or polysilicon 12 will form a tip structure 22 including the base 24 and the sharp point 26. The oxide bumper 20 and the amorphous silicon or polysilicon 12 will form a partial or pseudo parabolic relationship in the example shown. Since oxidation rates are well known and easily controllable, the size and shape of the tip structure 22 can be precisely controlled.

Figure 7:
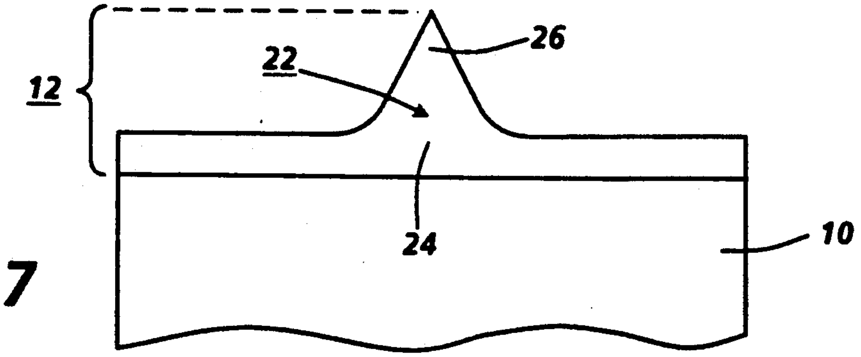
FIG. 7 is a cross-section of the substrate shown in FIG. 6 after oxide removal exposing the tip structure.

The final step, as shown in FIG. 7 is removal of the oxide and nitride layers by well known conventional process steps leaving the fully formed tip structure 22 exposed.

The above process sequenced described the steps necessary to produce a single tip. A slight modification of the process steps will produce opposing tip pairs. In the following sequence for opposing tip pairs, like structures will use the same numbers but with an "a" appended to indicate that they belong to the opposed tip pair sequence.

Figure 8:
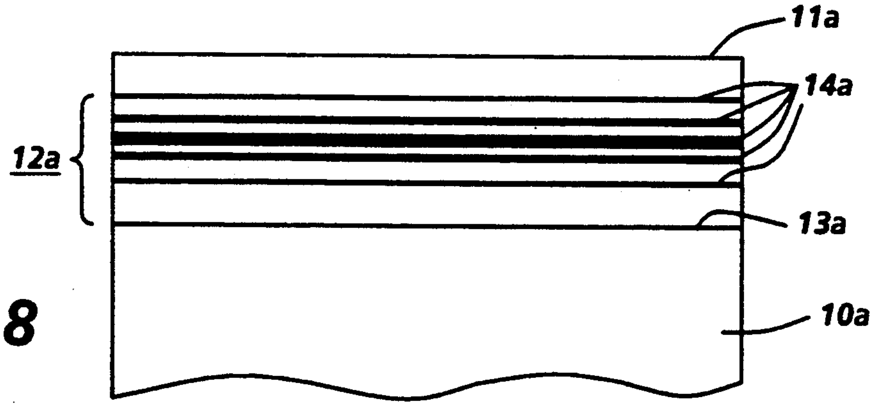
FIG. 8 is a cross-section of a substrate after deposition of a structural layer of amorphous silicon or polysilicon.
Figure 9:
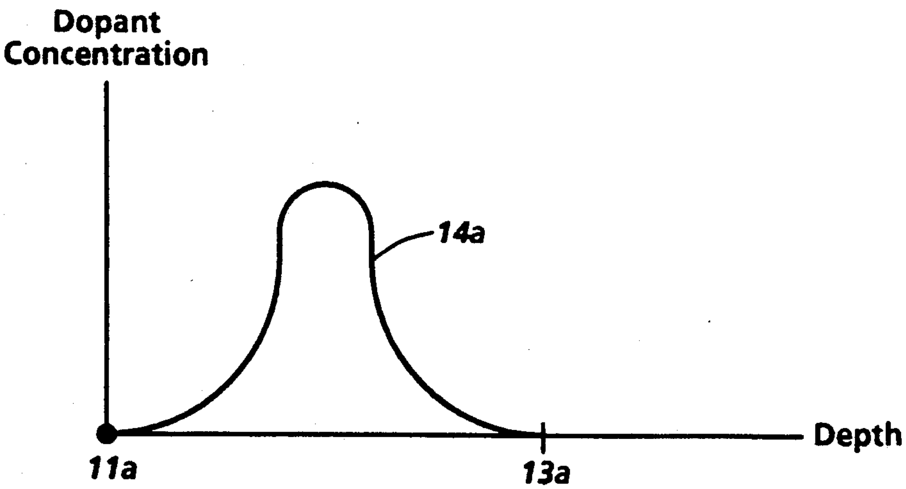
FIG. 9 is a graph describing the dopant concentration in the structural layer of amorphous silicon or polysilicon shown in FIG. 8.

Again, the structure is produced on a substrate **10*a* as shown in FIG. 8. While silicon is convenient for the substrate 10*a* it is not necessary for the process. A layer of amorphous silicon or polysilicon 12*a*, with a surface 11*a*, is deposited on the substrate 10*a*. The amorphous silicon or polysilicon 12*a* will have a dopant concentration profile 14*a*, as shown in FIGS. 8 and 9, that is highest near the middle of the amorphous silicon or polysilicon 12*a*. The dopant concentration will be the least at the amorphous silicon or polysilicon 12 interface 13 with the substrate 10*a* and at the surface 11*a* of the amorphous silicon or polysilicon 12*a***. This dopant concentration can be accomplished in several ways, either by in situ doping or by ion implantation followed by annealing. Both of these processes are well known and standard in the art.

Figure 10:
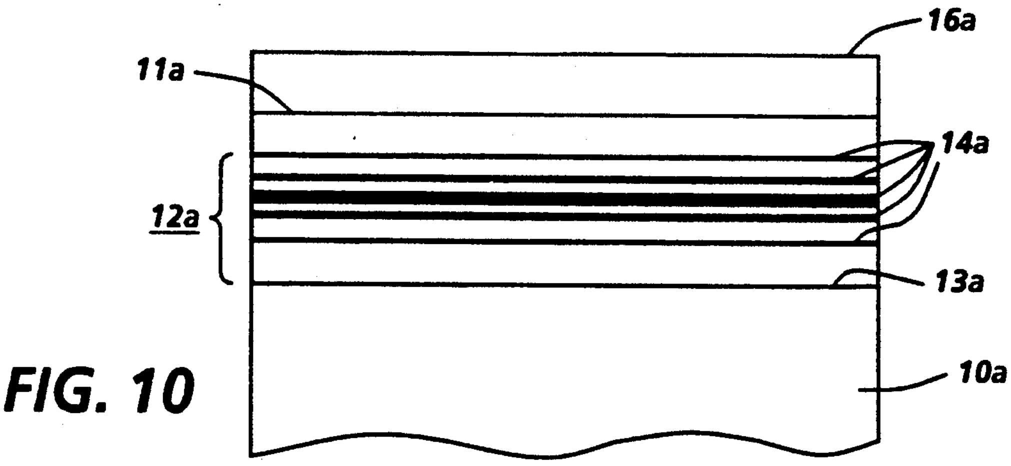
FIG. 10 is a cross-section of the substrate shown in FIG. 8 after nitride deposition.

In FIG. 10, a nitride layer **16*a* has been deposited on the amorphous silicon or polysilicon 12*a*. If it is desired to produce the dopant concentration profile 14*a* by ion implantation and annealing rather, than by in situ doping, the ion implantation and annealing steps may be done before the deposition of the nitride layer 16*a***.

Figure 11:
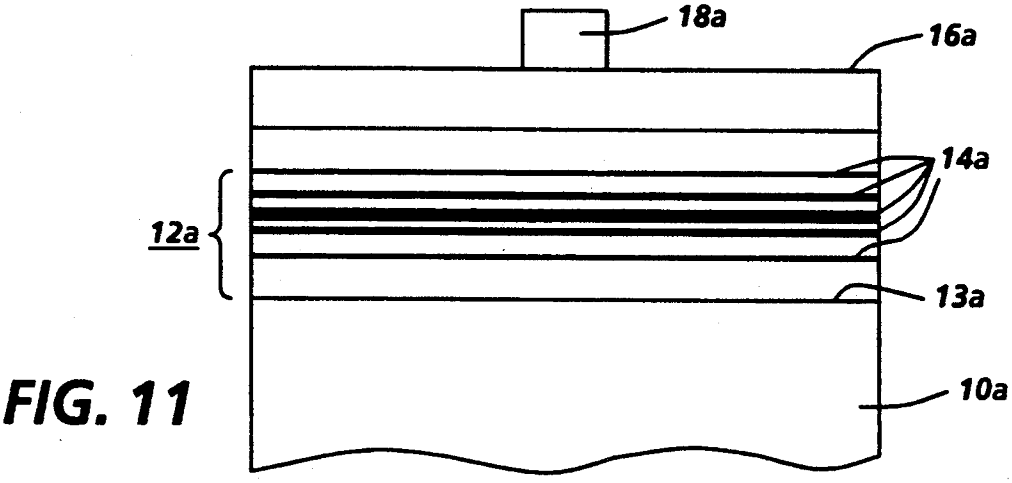
FIG. 11 is a cross-section of the substrate shown in FIG. 10 after photoresist patterning.
Figure 12:
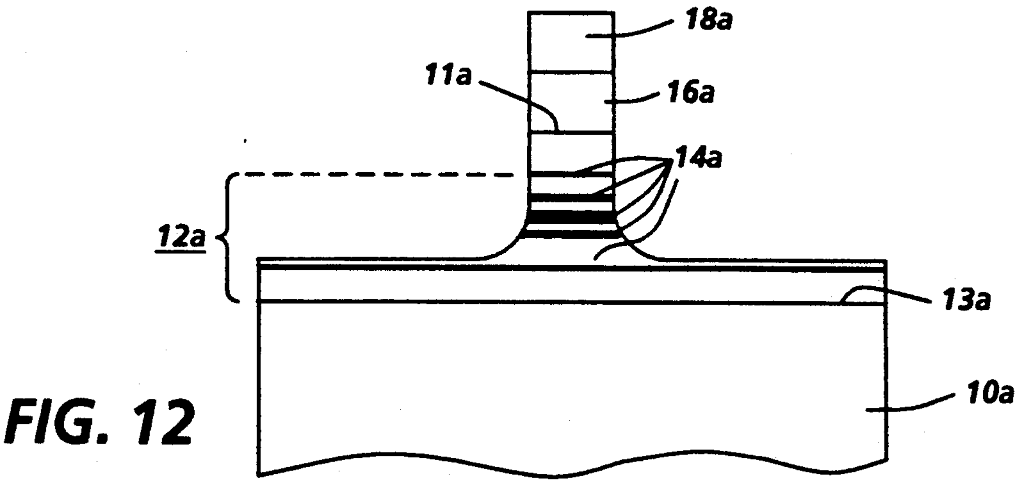
FIG. 12 is a cross-section of the substrate shown in FIG. 11 after patterning the structural layer of amorphous silicon or polysilicon.

As shown in FIG. 11 the next step is to pattern layers 16 and 12 by conventional photoresist process. FIG. 12, shows the nitride layer 16, and the amorphous silicon or polysilicon 12 etched using conventional dry etching techniques. The amorphous silicon or polysilicon **12*a* will have slightly concave sidewalls due to the dopant concentration profile 14*a* in the amorphous silicon or polysilicon 12*a***. The larger dopant concentration speeds up the etching process.

Figure 13:
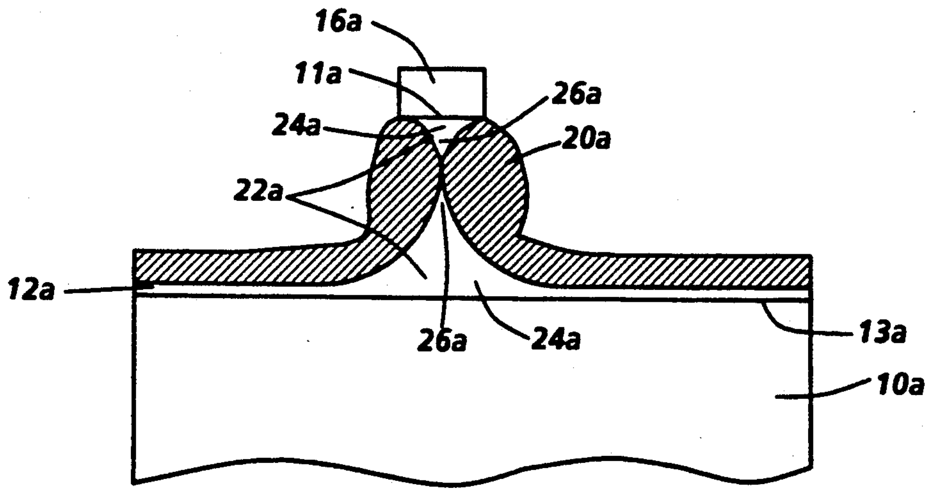
FIG. 13 is a cross-section of the substrate shown in FIG. 12 after oxidation.

The amorphous silicon or polysilicon **12*a* is then oxidized as shown in FIG. 13. The oxide bumpers will grow faster where the dopant concentration is the largest. Referring to FIGS. 8 and 9, the dopant concentration is the largest near the middle of the amorphous silicon or polysilicon 12*a*. The oxide bumper 20*a* will grow fastest and thickest near the middle of the amorphous silicon or polysilicon 12*a*. The oxidation rates will be fastest near the middle of the amorphous silicon or polysilicon 12 and decrease with the decreasing dopant concentration. As the oxide grows, the remaining unoxidized amorphous silicon or polysilicon 12*a* will form a dual opposed tip structure 22a with two bases 24a and two sharp points 26a. The oxide bumper 20a and the amorphous silicon or polysilicon 12a will form a partial or pseudo hyperbolic relationship. Since oxidation rates are well known and easily controllable, the size and shape of the dual opposed tip structure 22a** can be precisely controlled.

Figure 14:
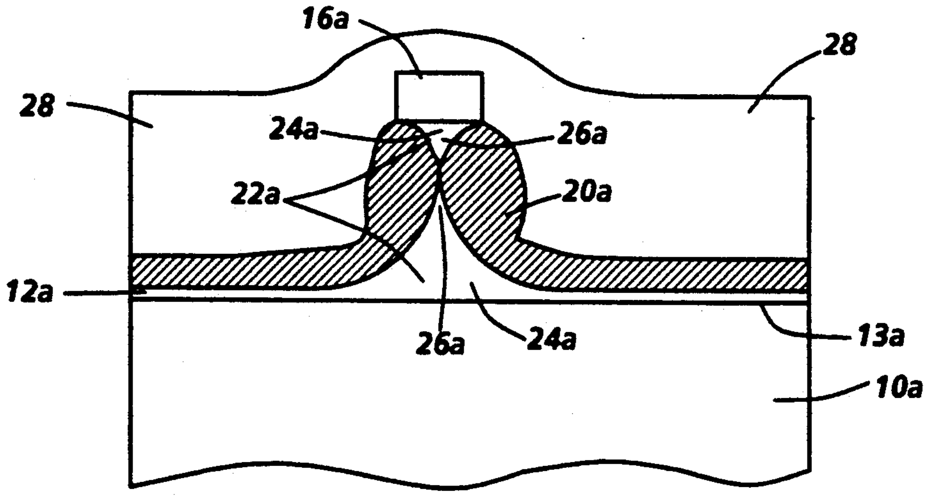
FIG. 14 is a cross-section of the substrate shown in FIG. 13 after photoresist deposition.
Figure 15:
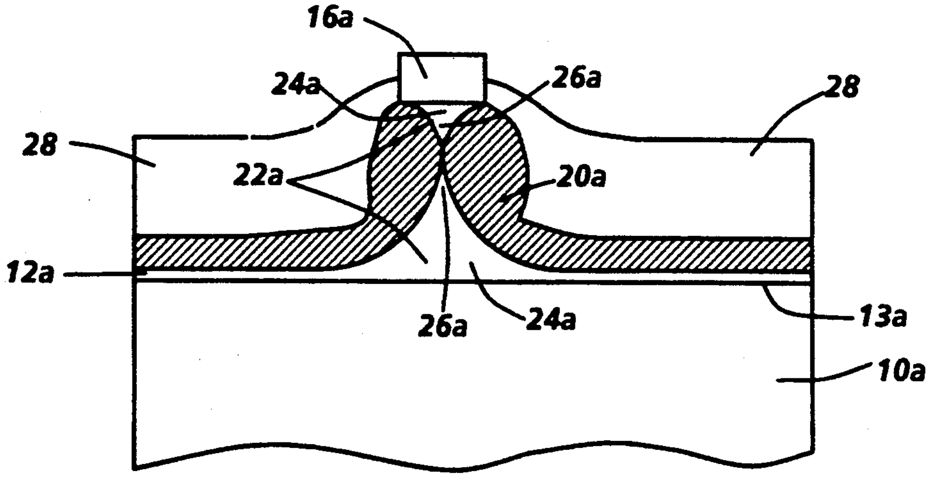
FIG. 15 is a cross-section of the substrate shown in FIG. 14 after photoresist etch back.
Figure 16:
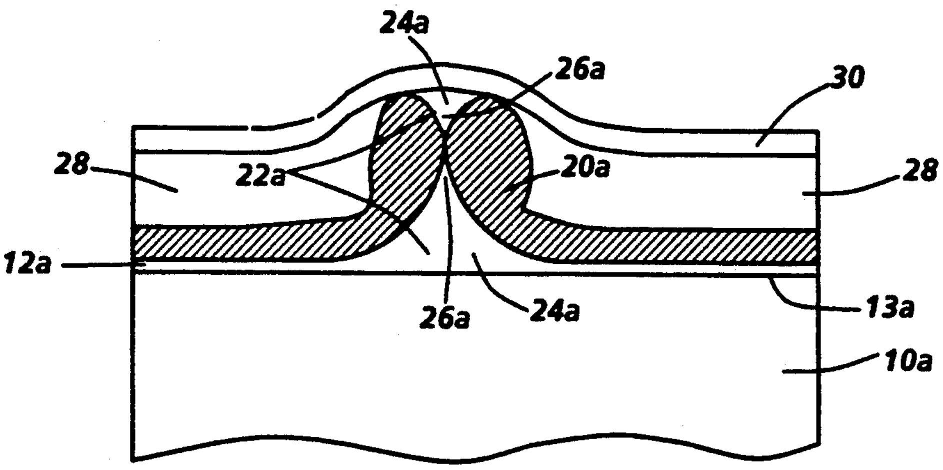
FIG. 16 is a cross-section of the substrate shown in FIG. 15 after metal deposition.

As shown in FIG. 14, a layer of planarizing photoresist 28 is spun on the exposed surfaces. This is done to provide a method for attaching the upper tip to a lever arm. In FIG. 15, the photoresist 28 is etched to reveal the nitride layer 16 on the base 24a of the upper tip. Then as shown in FIG. 16, first the nitride layer 16 is removed and a layer of metal 30 or other material is deposited on the surface of the photoresist 28 and the base 26a of the upper tip.

Figure 17:
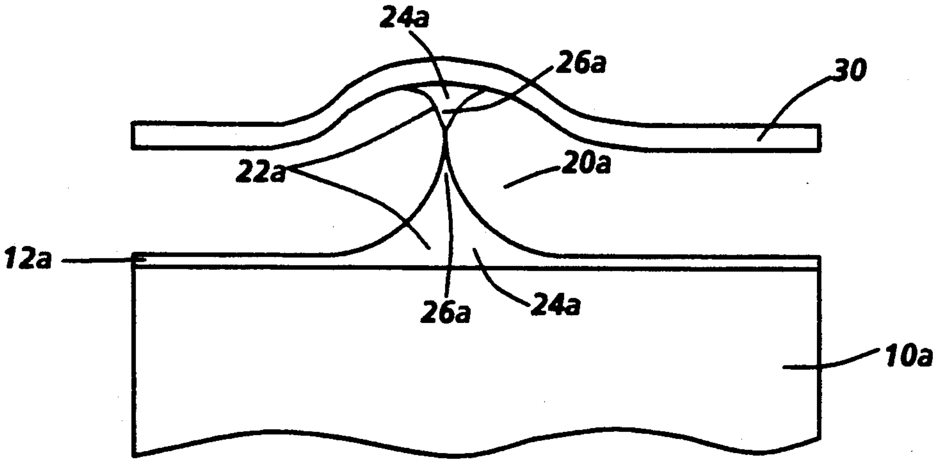
FIG. 17 is a cross-section of the substrate shown in FIG. 16 after photoresist and oxide removal.

Once the metal 30 is patterned in any conventional manner to be attached to other portions of the substrate, or other structures present on the substrate the photoresist 28 and the oxide bumper 22a can be removed to expose the opposed tip pair 22a as is shown in FIG. 17.

While the present invention has been described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

What is claimed is:

1. A process for making a tip comprising;

a. providing a structural member having wall means extending from a generally planar surface with said wall means having a surface spaced from and generally parallel to the generally planar surface, said wall means having a concentration gradient of bumper growth controlling material such that a portion of said wall means located between said surfaces has a higher concentration of the bumper growth controlling material than the rest of said wall means, b. growing bumper means into said wall means to convert said wall means into said bumper means with complete conversion occurring at said portion with the higher concentration of bumper growth controlling material and less than complete conversion occurring at the rest of said wall means to form at least one tapered tip on the non-converted portion of said wall means, and c. removing said bumper means from said wall means such that the tapered tip is exposed.

2. The process in claim 1 wherein said wall means prior to growing said bumper means is cylindrical and said resulting tip is conical.

3. The process in claim 1 wherein said wall means prior to growing said bumper means is multi-sided and said resulting tip is a multi-sided pyramid.

4. The process in claim 1 wherein said wall means prior to growing said bumper means is elongated and said resulting tip is a rail.

5. The process in claim 1 wherein the heavily concentrated portion is located near said surface spaced from said generally planar surface of said wall means.

6. The process in claim 1 wherein said bumper means comprises an oxide.

7. The process in claim 6 wherein said bumper growth controlling means is a dopant.

8. The process in claim 1 wherein the completely converted portion is located such that there is a non-converted portion between the completely converted portion and the surface spaced from said generally planar surface and another non-converted portion between the completely converted portion and the generally planar surface to form two opposed tips.

9. The process in claim 8 wherein said surface spaced from generally planar surface is nitride.

10. The process in claim 1 comprising the additional steps of in situ doping of a dopant into said wall means to provide said concentration gradient of bumper growth controlling means.

11. The process in claim 1 comprising the additional steps of implanting a dopant, and diffusion of the dopant into said wall means to provide said concentration gradient of bumper growth controlling means.

12. The process in claim 1 wherein said wall means comprises a layer of polysilicon covered with a layer of nitride, said surface spaced from said generally planar surface being said layer of nitride.

13. The process in claim 1 wherein said structural layer comprises a layer of amorphous silicon covered with a layer of nitride, said surface spaced from said generally planar surface being said layer of nitride.

* * * * *